United States Patent [19]

Loeffler et al.

[11] Patent Number: 4,528,510

[45] Date of Patent: Jul. 9, 1985

[54] DEVICE FOR GENERATING IMAGES OF AN OBJECT UNDER EXAMINATION USING NUCLEAR MAGNETIC RESONANCE

[75] Inventors: Wilfried Loeffler, Herzogenaurach; Arnulf Oppelt, Erlangen, both of Fed. Rep. of Germany

[73] Assignee: Siemens Aktiengesellschaft, Berlin and Munich, Fed. Rep. of Germany

[21] Appl. No.: 522,135

[22] Filed: Aug. 11, 1983

[30] Foreign Application Priority Data

Sep. 22, 1982 [DE] Fed. Rep. of Germany ....... 3235113

[51] Int. Cl.³ ............................................. G01R 33/08
[52] U.S. Cl. .................................... 324/309; 324/308
[58] Field of Search ............... 324/300, 307, 308, 309, 324/317, 318

[56] References Cited

U.S. PATENT DOCUMENTS

| | | | |
|---|---|---|---|
| 3,427,532 | 2/1969 | Nelson | 324/308 |
| 3,501,688 | 3/1970 | Nelson | 324/0.5 |
| 3,531,715 | 9/1970 | Watson | 324/308 |
| 4,050,009 | 9/1977 | Sagalyn | 324/308 |

FOREIGN PATENT DOCUMENTS 2043914 10/1980 United Kingdom .

Primary Examiner—Michael J. Tokar
Attorney, Agent, or Firm—Mark H. Jay

[57] ABSTRACT

The invention involves a device for generating images using nuclear magnetic resonance in which coils are provided for applying magnetic fields to the patient and for recording the displacement of the atomic nuclei of the patient from their equilibrium state by a high-frequency magnetic excitation pulse. Calibration devices are attached in the coils so that, for each image plane selected, they are at least partially intersected by the image plane during measurement of a patient.

1 Claim, 5 Drawing Figures

DEVICE FOR GENERATING IMAGES OF AN OBJECT UNDER EXAMINATION USING NUCLEAR MAGNETIC RESONANCE

BACKGROUND OF THE INVENTION

The invention relates to a device for generating images of an object of examination using nuclear magnetic resonance, in which coils are present for applying magnetic fields to the object of examination and for recording the displacement of the atomic nuclei of the object of examination from their equilibrium state by a high-frequency magnetic excitation pulse.

It is known that the nuclei of hydrogen atoms of the object under examination can be displaced from a preferred direction, by a high-frequency excitation pulse generated by a basic magnetic field, and that, due to their spin, the atomic nuclei return to the state of equilibrium in the preferred direction only after a specific time following the end of the excitation pulse. During this time, the atomic nuclei precess with a frequency which is dependent upon the strength of the basic magnetic field. If a field gradient is superimposed on this homogeneous basic magnetic field so that the distribution of the magnetic field varies in density, an orientation is possible via the respective measured frequency. It is also known that planographs of the object under examination can be prepared both in the above manner and by changing the direction of the field gradient. In this case, excitation in a section of the object under examination is achieved by influencing the basic magnetic field with an additional field gradient in such a manner that the atomic nuclei in this section are excited, since excitation occurs only at a frequency that is strictly assigned to the magnetic field in the desired section. Basically, only quantities such as those given below can be directly measured and graphically illustrated with a device of the type described in the preceding paragraphs:

$$S = c \cdot f(\rho, T_1, T_2)$$

In this equation, S is the measured signal and f is a function of the designated quantities which vary with the measurement procedure used. $\rho$ is the density and $T_1$ and $T_2$ are the relaxation times of the excited atomic nuclei. c is a constant that designates the sensitivity of the apparatus. By standardizing several sets of recorded data by using different recording parameters, it is basically possible to calculate absolute values for $T_1$ and $T_2$. The objective here is also to measure the directly accessible quantities of S in a reproducible manner and to measure with a sensitivity, and therefore a range, which is the same for different patients.

In practice this objective encounters a series of partially unavoidable effects which influence the sensitivity c of the measuring system and which therefore prevent the directly measured values from being reproducible and transferable. In particular, the different attenuation of the receive coil for patients of different diameters, for example, causes such an unavoidable change in the sensitivity of the measuring system. In practice, a calculation of absolute values for $T_1$ and $T_2$ will also be repeatedly incorrect due to the attenuation of the transmit pulses which vary from patient to patient, and result in incorrect high-frequency pulses. For standardization when using a device of the type previously described, a calibration device is usually provided with which calibration measurements can be made (GB 20 43 914). However, this calibration device is not suitable for use during the examination of a patient, because it can not be used for simultaneous measurements on the patient and for calibration measurements. It is also known that, in a device described in the beginning of this section, both a sample to be examined and a calibration sample must be provided (U.S. Pat. No. 3,501,688). In this device, however, there is no provision for simultaneously examining the patients and making calibration measurements.

SUMMARY OF THE INVENTION

The object of the invention is carried out by a calibration device designed to at least partially surround the object of examination externally during measurement, and that, for each image plane selected, is at least partially intersected by the image plane during measurement. In this invention a calibration device with defined values of $\rho$, $T_1$ and $T_2$ is located near the perimeter of the measured field so that it is possible to measure the section being examined and the calibration device simultaneously and thus standardize the received signals.

Functionally, a calibration device consists of aqueous solutions of a paramagnetic salt, the concentration of which is used to set a relaxation time similar to tissues.

These solutions are preferably located in permanently sealed glass containers to prevent the evaporation of the water and, consequently, a change in the concentration.

Correction of the measurement values with regard to varying receiver sensitivity can be accomplished advantageously by using the measured signal from the calibration device area as the standard for the sensitivity of the system, and recalculating all measurement values from the area of the object under examination to a constant sensitivity using an appropriate factor.

Other features and advantages of the invention will be apparent from the following detailed description and from the claims.

For a full understanding of the present invention, reference should now be made to the following detailed description and to the accompanying drawings.

DETAILED DESCRIPTION

Figure 1:
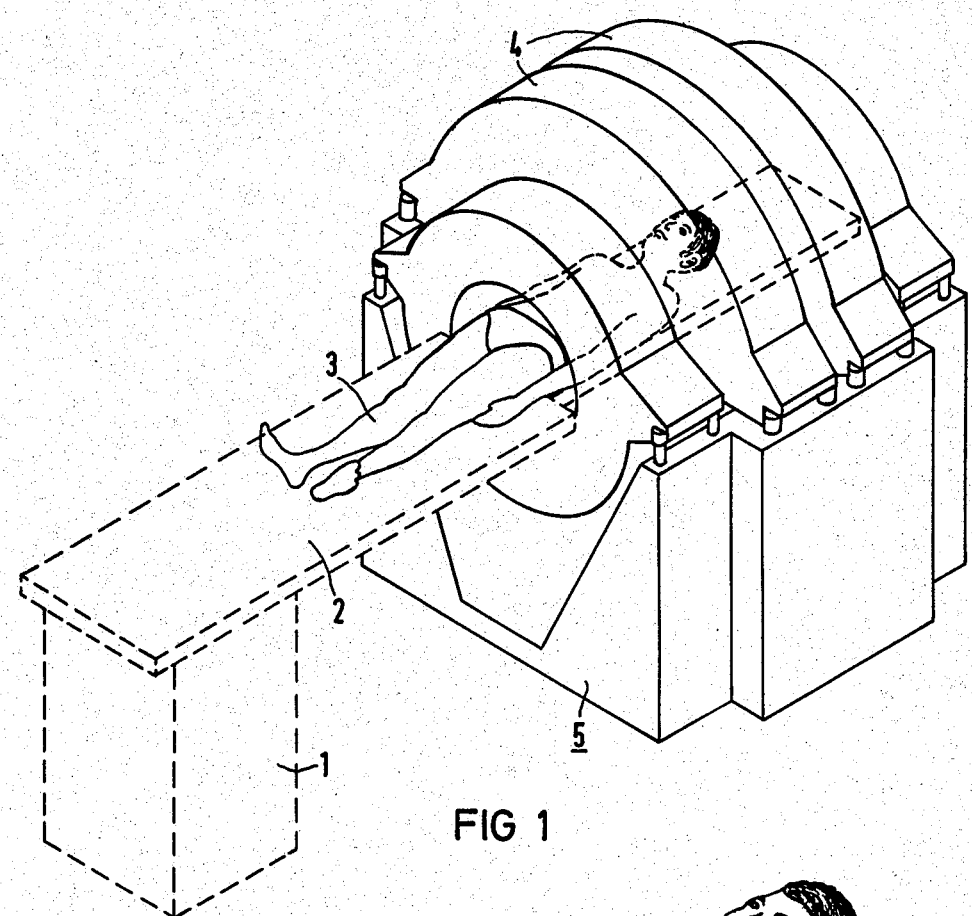
FIG. 1 shows diagrammatically a device for generating images using nuclear magnetic resonance.

FIG. 1 shows examination table 2 mounted on base 1 with a patient 3 lying on the table. The patient is lying inside coils 4 of a device for generating images of an object under examination using nuclear magnetic resonance. Coils 4 are used to apply magnetic fields to patient 3 and to record the displacement of the patient's atomic nuclei from their state of equilibrium by a high-frequency magnetic excitation pulse. Coils 4 are attached to support 5.

Figure 2:
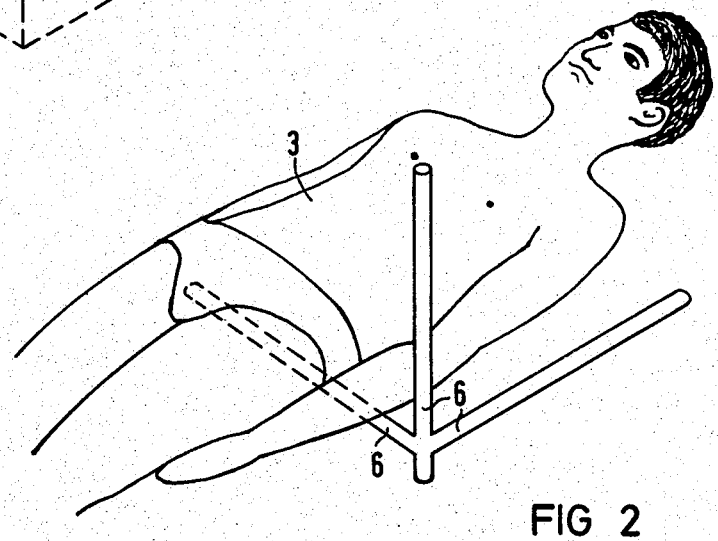
FIG. 2 shows diagrammatically a calibration device which can be used in the device shown in FIG. 1.

FIG. 2 shows that calibration device 6 is arranged in such a manner inside coils 4 that for each image plane selected, it is at least partially intersected by the image plane during measurement of patient 3. Calibration device 6 consists of three fluid-filled, straight, and cylindrical glass tubes that are arranged at right-angles to each other. This insures that one glass tube will always be intersected by the investigated plane for axial, coronary, and sagittal sections.

Figure 3:
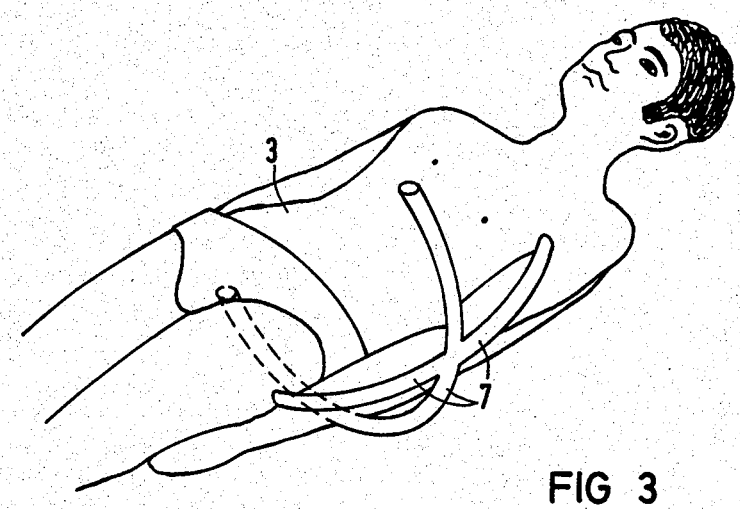
FIGS. 3, 4, and 5 show preferred embodiments of the calibration device.

Calibration device 7, shown in FIG. 3, consists of three curved fluid-filled glass tubes with a circular profile and adapted to the spherical, usable measuring volume of coils 4.

The planes encompassed by the three curved tubes are perpendicular to each other. This insures that even in the case of section orientations that are at an angle with respect to the axial, coronary, and sagittal planes, one glass tube of the calibration device is always intersected at the perimeter of the measured field and is therefore included in the measurements.

Figure 4:
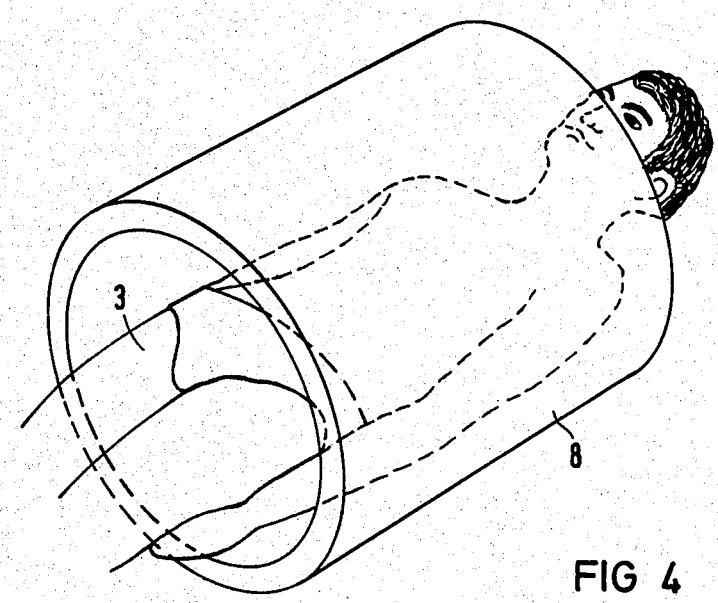

FIG. 4 shows a calibration device 8 in the form of a fluid-filled, double-walled, cylindrical tube. This also insures that areas of the calibration device for all section orientations are included in the measurements, and thus can be used for standardization.

Figure 5:
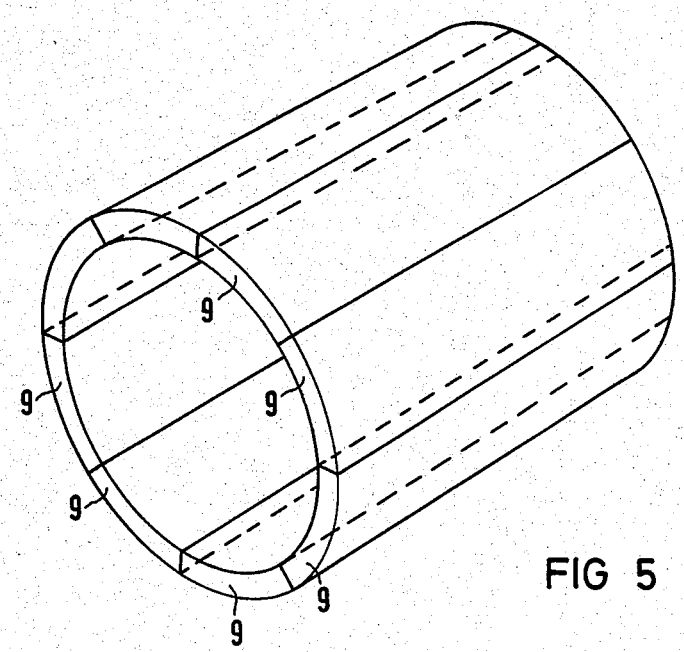

To correct the effects of the varying attenuation of the transmit coil and the resulting errors in the high-frequency pulses, the specific measurement sequence used must be taken into consideration. The effects of these errors on the functional relationship f, which are different for each measurement sequence, must be examined and suitable correction procedures implemented. This is possible because the measured values of the calibration device permits calculation of the transmit coil attenuation. Under certain circumstances, it may be necessary to subdivide the calibration device into several chambers 9 (shown in FIG. 5) containing substances with different values for $\rho$, $T_1$ and $T_2$ in order to permit an experimental separation of the attenuation of the receiver coil and the transmit coil.

An additional advantage of placing a calibration device in the field of measurement is that a nuclear resonance signal can also be measured in the intervals between examinations when no patient is in the measurement apparatus, so that, for example, the strength of the magnetic field can be recalibrated. The design of the calibration device shown in FIG. 2 also permits it to distinguish from which direction the displayed measured section is being viewed (front view, rear view, top, bottom, right or left).

There has thus been shown and described novel apparatus for generating images of an object under examination using nuclear magnetic resonance which fulfills all the objects and advantages sought. Many changes, modifications, variations and other uses and applications of the subject invention will, however, become apparent to those skilled in the art after considering this specification and the accompanying drawings which disclose embodiments thereof. All such changes, modifications, variations and other uses and applications which do not depart from the spirit and scope of the invention are deemed to be covered by the invention which is limited only by the claims which follow.

We claim:

1. In a device for generating images of an object under examination using nuclear magnetic resonance in which coils are provided for applying magnetic fields to the object under examination, and for recording the displacement of the atomic nuclei of the object under examination from their equilibrium state by a high-frequency magnetic excitation pulse, and in which at least one calibration device is attached to the coils, the improvement comprising, a calibration device designed so that it at least partially encompasses the object of examination externally during measurement, and that, for each image plane selected, it is at least partially intersected by the image plane during measurement.

* * * * *